US007816689B2

(12) United States Patent
Wu

(10) Patent No.: US 7,816,689 B2
(45) Date of Patent: Oct. 19, 2010

(54) EMBEDDED PACKAGE STRUCTURE MODULE WITH HIGH-DENSITY ELECTRICAL CONNECTIONS AND METHOD FOR MAKING THE SAME

(75) Inventor: Ming-Che Wu, Chiayi (TW)

(73) Assignee: Universal Scientific Industrial Co., Ltd., Nan-Tou (TW)

( * ) Notice: Subject to any disclaimer, the term of this patent is extended or adjusted under 35 U.S.C. 154(b) by 53 days.

(21) Appl. No.: 12/216,397

(22) Filed: Jul. 3, 2008

(65) Prior Publication Data

US 2010/0001295 A1 Jan. 7, 2010

(51) Int. Cl.
*H01L 33/00* (2010.01)

(52) U.S. Cl. .................. 257/79; 257/88; 257/E33.056; 438/28

(58) Field of Classification Search .................... 257/79
See application file for complete search history.

(56) References Cited

U.S. PATENT DOCUMENTS

| | | | | |
|---|---|---|---|---|
| 6,498,356 | B1 * | 12/2002 | Sekiya et al. | 257/113 |
| 2003/0205806 | A1 * | 11/2003 | Chang et al. | 257/725 |
| 2009/0184332 | A1 * | 7/2009 | Wu | 257/88 |

* cited by examiner

*Primary Examiner*—Jarrett J Stark
*Assistant Examiner*—Lawrence Tynes, Jr.
(74) *Attorney, Agent, or Firm*—Kile Goekjian Reed & McManus PLLC

(57) ABSTRACT

An embedded package structure module with high-density electrical connections, including: a drive IC structure, an LED array structure and a plurality of conductive structures. The drive IC structure has at least one concave groove. The LED array structure is received in the at least one concave groove of the drive IC structure, and the LED array structure has a plurality of second open grooves formed on its lateral wall and close to the drive IC structure. The conductive structures respectively traverse the second open grooves in order to make the conductive structures electrically connect between the drive IC structure and the LED array structure.

8 Claims, 16 Drawing Sheets

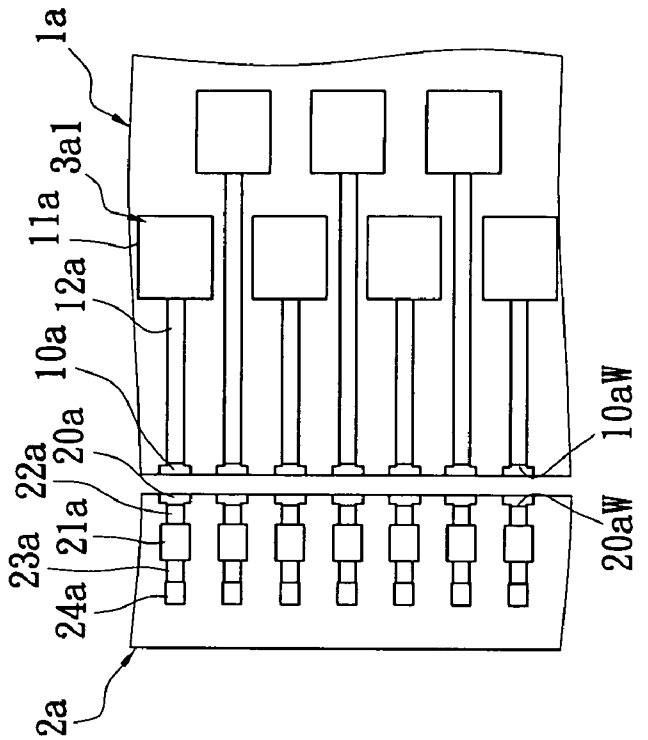
FIG. 1A2
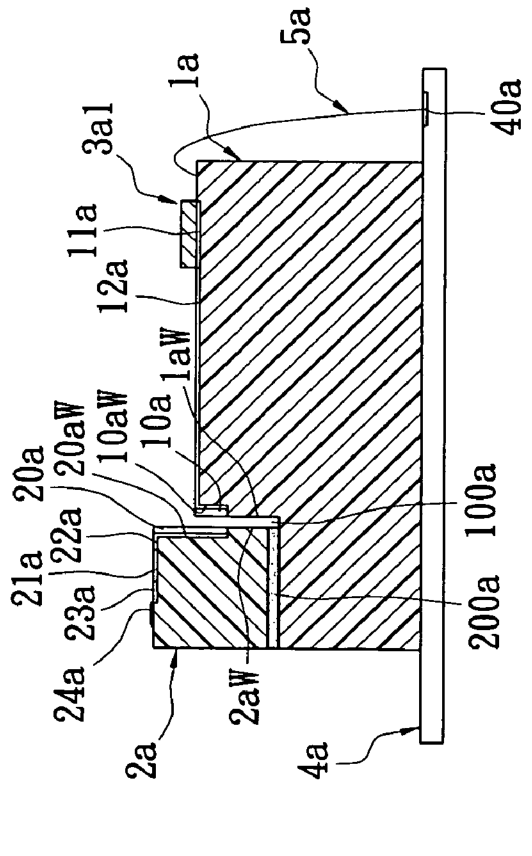
FIG. 1A1

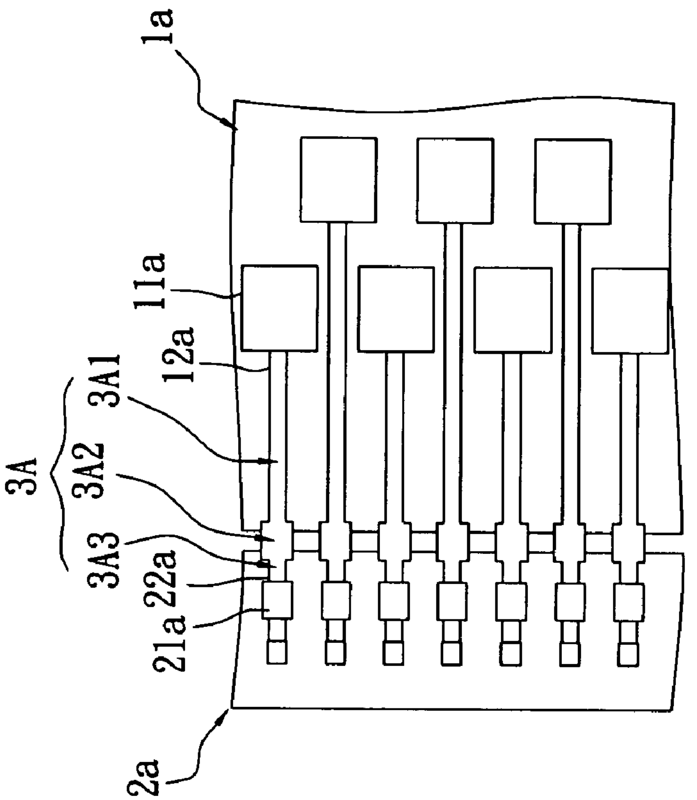
FIG. 1D2
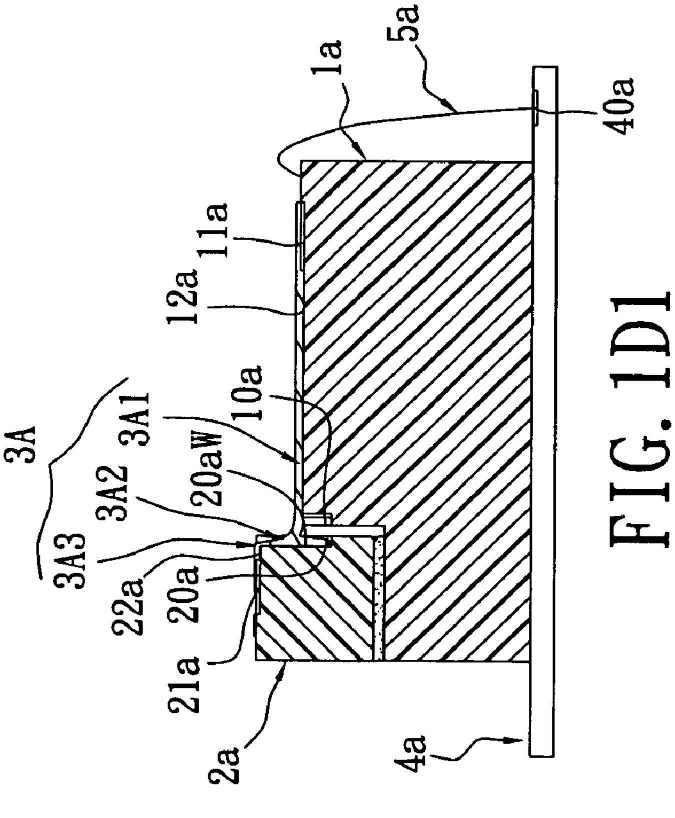
FIG. 1D1

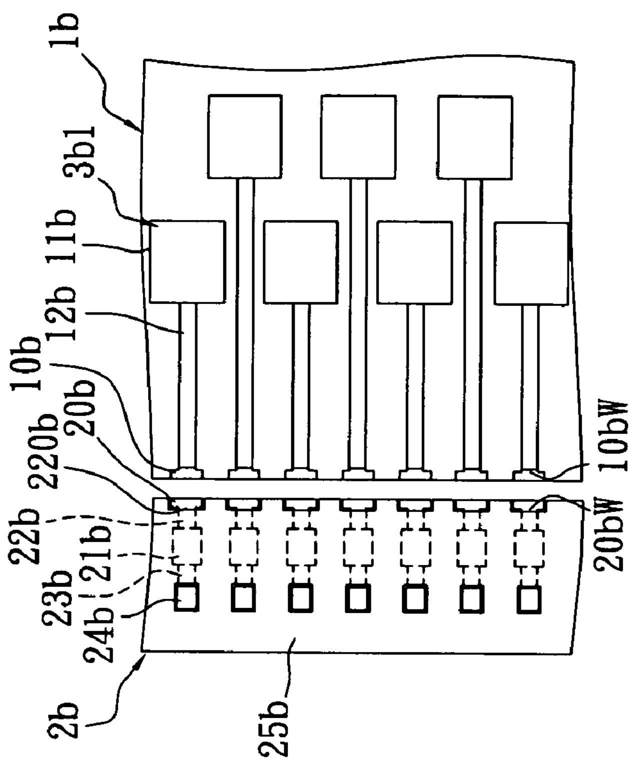
FIG. 2A2
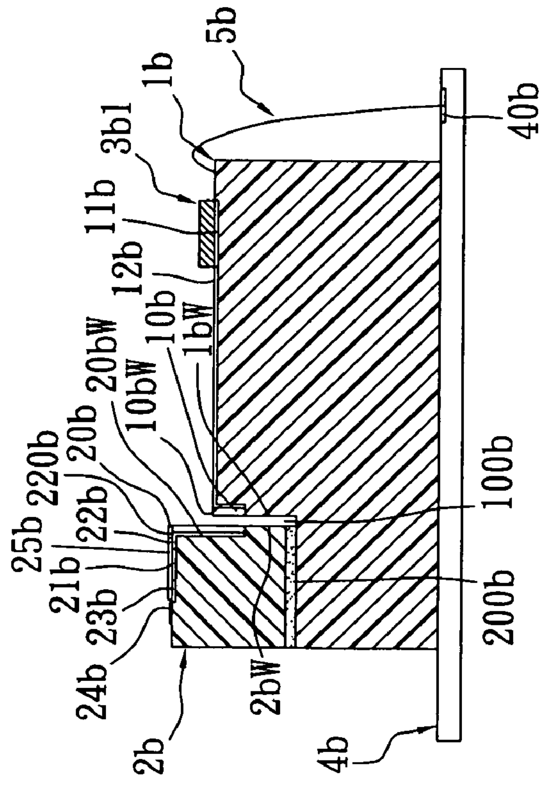
FIG. 2A1

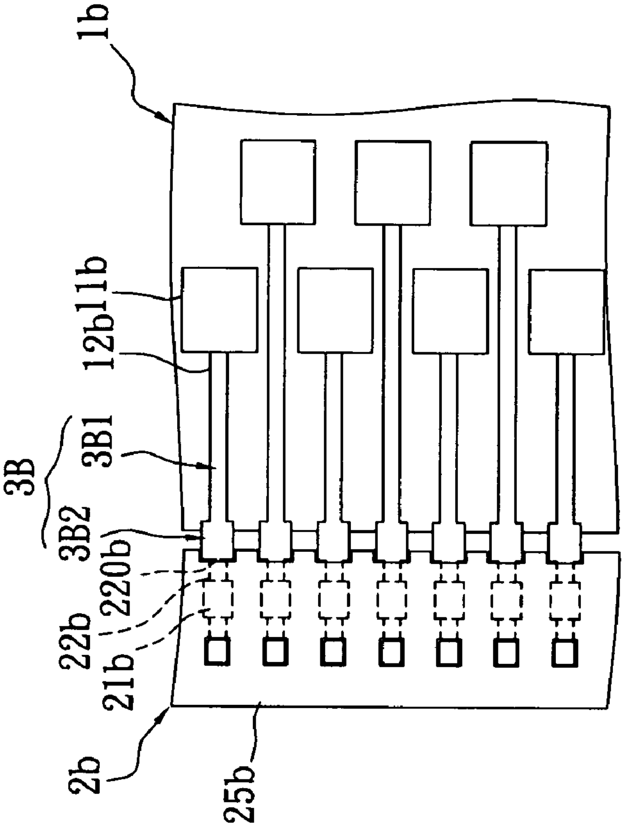
FIG. 2D2
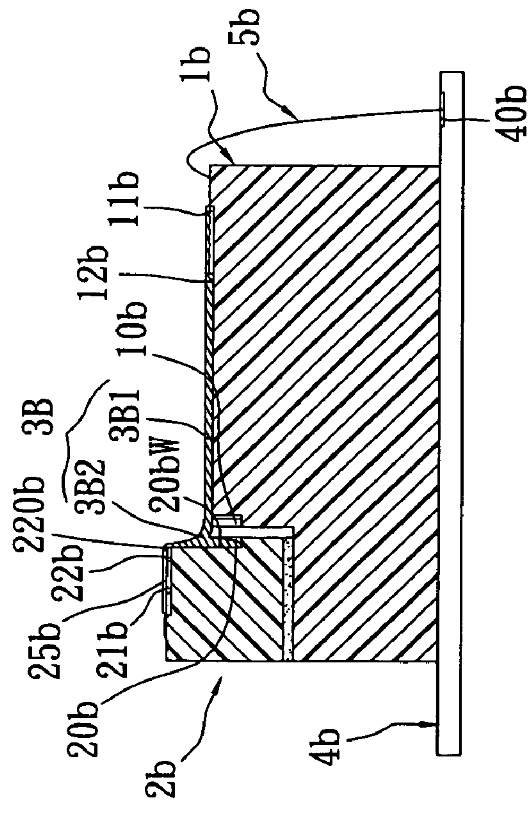
FIG. 2D1

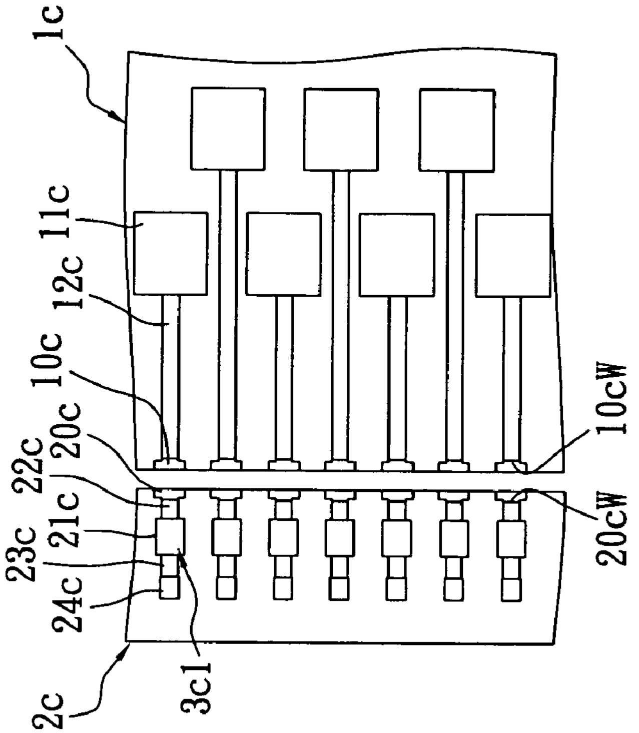
FIG. 3A2
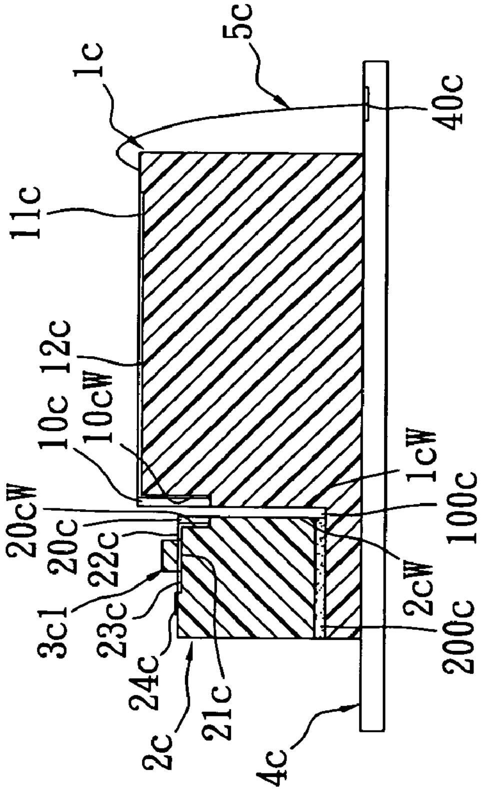
FIG. 3A1

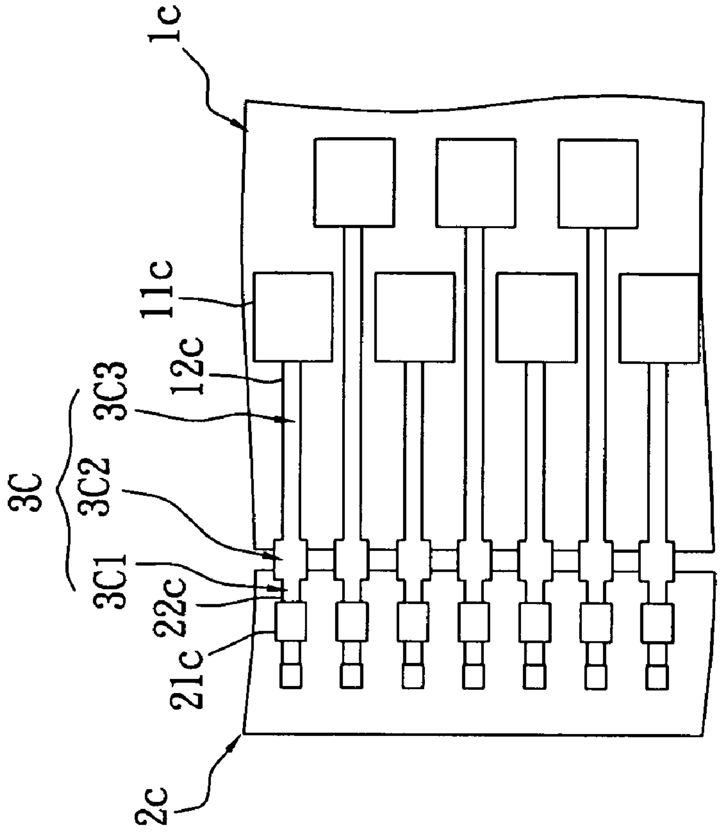
FIG. 3D2
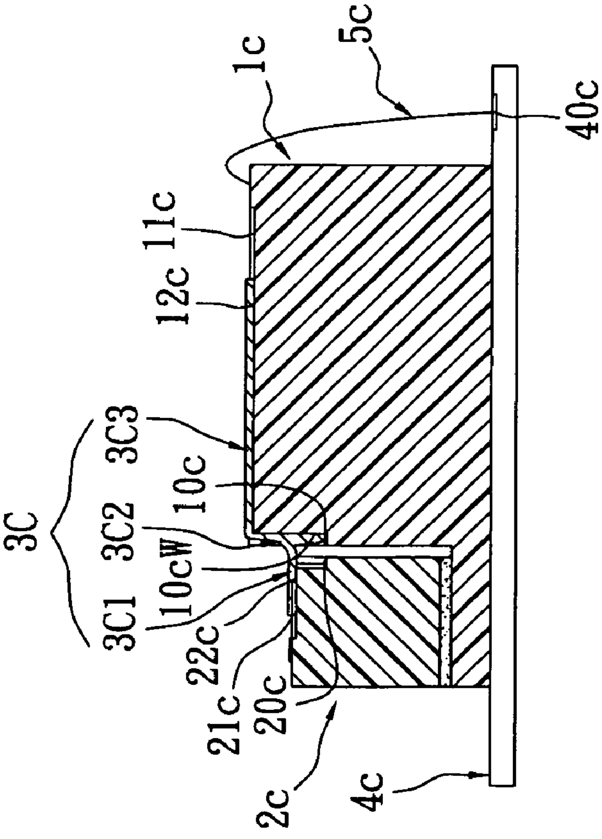
FIG. 3D1

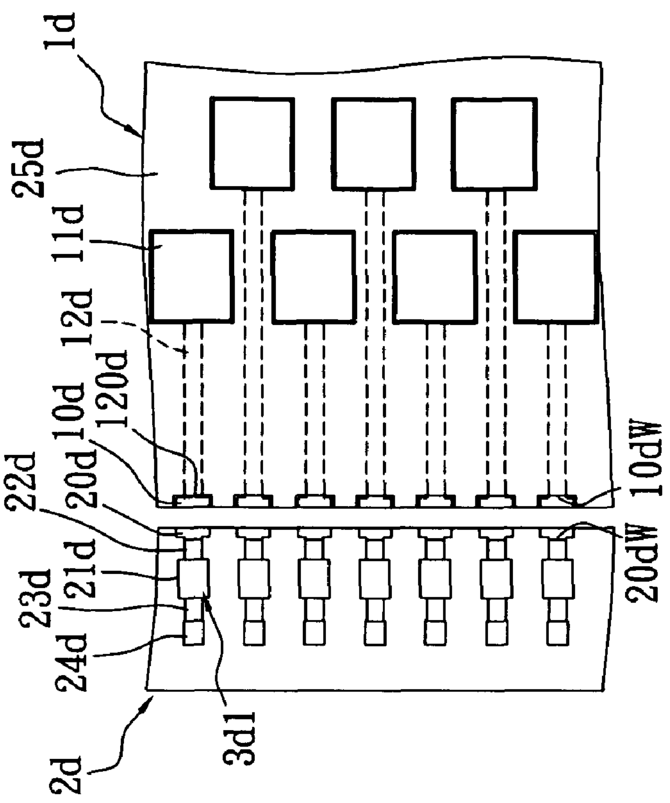
FIG. 4A2
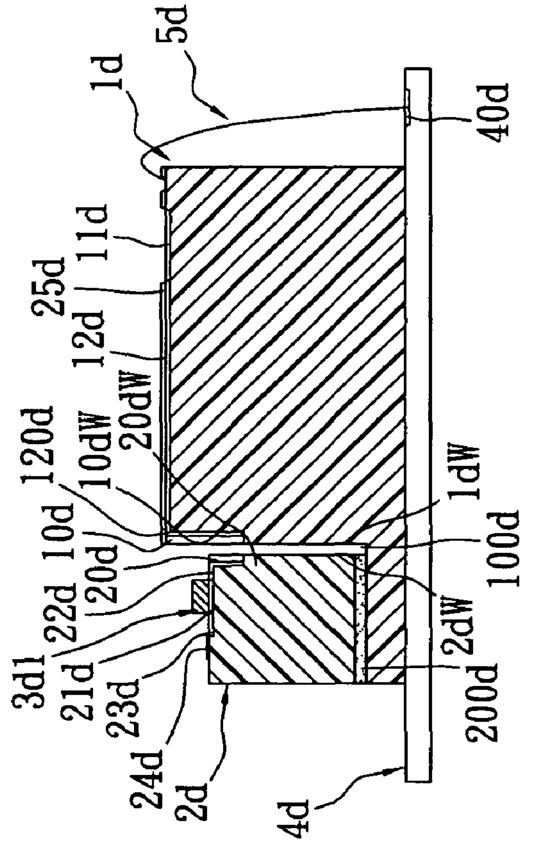
FIG. 4A1

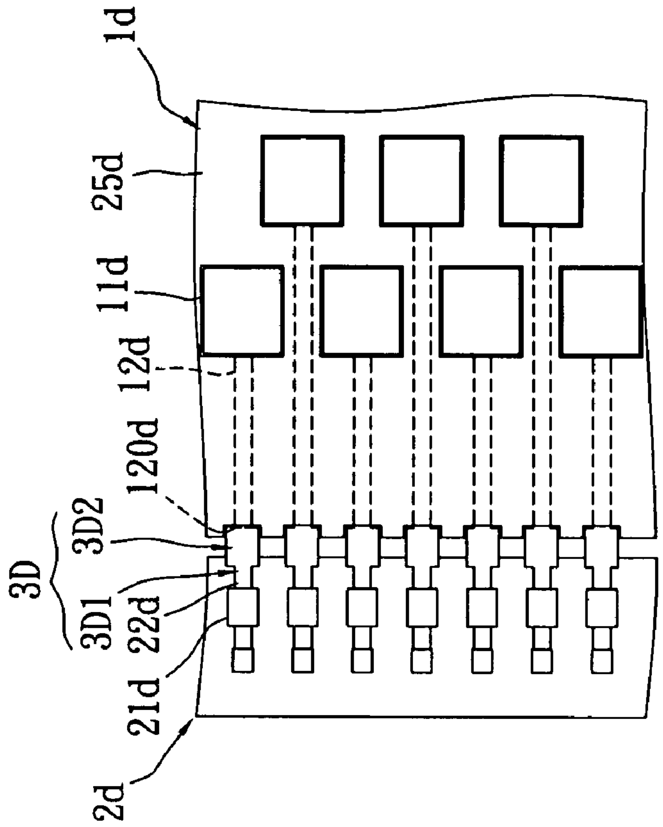
FIG. 4D2
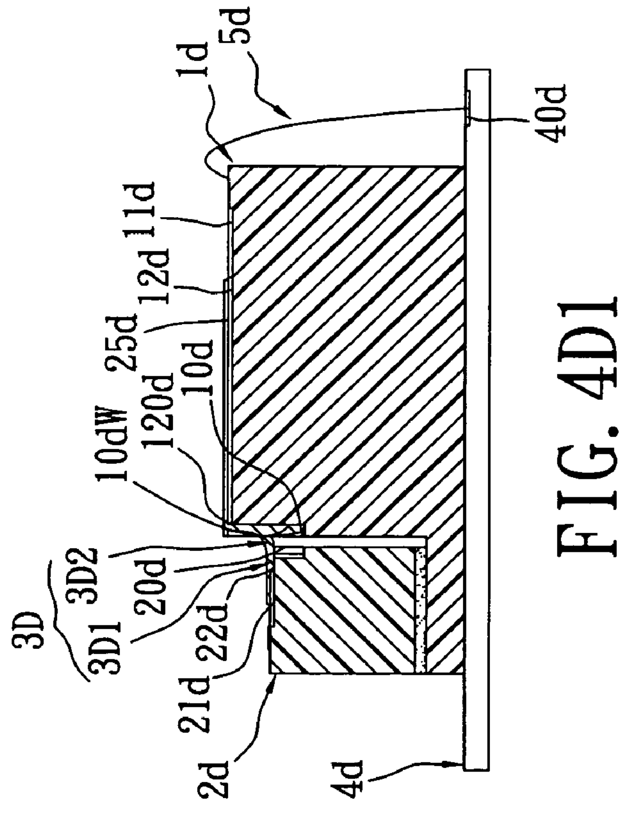
FIG. 4D1

EMBEDDED PACKAGE STRUCTURE MODULE WITH HIGH-DENSITY ELECTRICAL CONNECTIONS AND METHOD FOR MAKING THE SAME

BACKGROUND OF THE INVENTION

1. Field of the Invention

The present invention relates to an embedded package structure module and a method for making the same, and particularly relates to an embedded package structure module with high-density electrical connections and a method for making the same.

2. Description of the Related Art

In the typical printer technology, a laser is used as a light source in a printer head to scan and transfer the printing information as light signals to a rotating drum in order to generate electrostatic latent images formed on the rotating drum. Moreover, the printing method further includes a toner absorbing step, a transferring step, a hot pressing step, an electrostatic discharging step etc. to reach printing. However, a laser printer head of the prior art has many optical components, and the mechanism of the laser printer head is complex and the optical path of the laser printer head is very long. Hence, the optical structure is quite complex and difficult to reduce in size when using a laser as light source. Therefore, the current trend is toward using light emitting diodes to replace lasers as the light sources in printer heads, which can simplify the optical structure.

Thereby, it is a requirement to reduce the volume of each light emitting diode so as to increase the resolution of the printer. More light emitting diodes can be fitted per unit area on the printer head when the volume of each light emitting diode is reduced. According to the typical packaging method, a highly precise packaging apparatus is required to arrange the light emitting diode arrays and the driver integrated circuits so that they are exactly parallel to each other in a printed circuit board. Then, a wire bonding process is performed to form about 5000 wires between the light emitting diode arrays and the driver integrated circuits if the resolution of the printer is 600 dpi (dots per inch) of A4 size paper. The driver integrated circuits drive the light emitting diode arrays through these wires.

A highly exact and dense wire bonding process in the foregoing method increases the difficulty of the packaging process. This reduces the product yield and indirectly raises the manufacturing costs. Moreover, reducing the volume of the light emitting diodes in order to increase the resolution of the printer, further increases the packaging difficulty.

In order to solve above-mentioned problem, the prior art provides a method for making a package structure module with high-density electrical connections, including: etching at least one concave groove on a top surface of the drive IC structure; receiving an LED array structure in the at least one concave groove; and forming a conductive connections electrically connected between the drive IC structure and the LED array structure via semiconductor procedures in order to achieve high-density electrical connections.

However, the method for making a package structure module with high-density electrical connections of the prior art is complex, and particularly relates to the semiconductor procedures. Hence, time and cost are increased. Therefore, a new package structure and method thereof is required to resolve the foregoing problems.

SUMMARY OF THE INVENTION

One particular aspect of the present invention is to provide an embedded package structure module with high-density electrical connections and a method for making the same. The embedded package structure module is an LED (Light Emitting Diode) array structure module, and the LED array structure module is a light exposure module that can be applied to an EPG (Electrophotography) printer.

The features of the present invention include (1) forming at least one concave groove on a top surface of a drive IC structure; (2) receiving an LED array structure in the at least one concave groove (there is a height difference between the drive IC structure and the LED array structure); (3) forming concave grooves on a lateral wall of the drive IC structure and a lateral wall of the LED array structure for electrically connection (the lateral wall of the drive IC structure is close to the lateral wall of the LED array structure); (4) electroplating solder materials onto the drive IC structure; (5) slanting the PCB by a predetermined angle during a reflow process in order to make the solder materials flow to the LED array structure on a low position to connect to the pads of the LED array structure. Hence, the present invention can reach a high-density electrical connection with 600~1200 dip. Therefore, the present invention can reduce product size, material cost, and manufacturing cost due to high-density electrical connection.

In order to reach the above-mentioned aspects, the present invention provides an embedded package structure module with high-density electrical connections, including: a drive IC structure, an LED array structure and a plurality of conductive structures. The drive IC structure has at least one concave groove. The LED array structure is received in the at least one concave groove of the drive IC structure, and the LED array structure has a plurality of second open grooves formed on its lateral wall and close to the drive IC structure. The conductive structures respectively traverse the second open grooves in order to make the conductive structures electrically connect between the drive IC structure and the LED array structure.

In order to reach the above-mentioned aspects, the present invention provides a method for making an embedded package structure module with high-density electrical connections, including: providing a drive IC structure with at least one concave groove and an LED array structure received in the at least one concave groove of the drive IC structure, wherein the drive IC structure has a plurality of conductive materials formed on its top surface, the LED array structure has a plurality of second open grooves formed on its lateral wall and close to the drive IC structure, and the height of the top surface of the LED array structure is larger than the height of the top surface of the drive IC structure; electrically disposing the drive IC structure on a substrate; slanting the substrate by a predetermined angle during a reflow process in order to make the conductive materials change into liquid conductive materials and make the liquid conductive materials traverse the second open grooves to flow to the LED array structure; and cooling the liquid conductive materials to form a plurality of conductive structures electrically connected between the drive IC structure and the LED array structure.

Therefore, the present invention does not need to use a wire-bonding process as in the prior art that requires a long time and the present invention can solve the problem of the complex method for making a package structure module with high-density electrical connections of the prior art. (particularly relates to the semiconductor procedures). Hence, the present invention not only can reduce product size, material cost, and manufacturing cost, but also increases production speed.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which:

FIGS. 1A1 to 1D2 are cross-sectional views of an embedded package structure module with high-density electrical connections according to the first embodiment of the present invention, at different stages of the packaging processes, respectively;

FIG. 2 is a flowchart of a method for making an embedded package structure module with high-density electrical connections according to the second embodiment of the present invention;

FIGS. 2A1 to 2D2 are cross-sectional views of an embedded package structure module with high-density electrical connections according to the second embodiment of the present invention, at different stages of the packaging processes, respectively;

FIGS. 3A1 to 3D2 are cross-sectional views of an embedded package structure module with high-density electrical connections according to the third embodiment of the present invention, at different stages of the packaging processes, respectively;

FIGS. 4A1 to 4D2 are cross-sectional views of an embedded package structure module with high-density electrical connections according to the fourth embodiment of the present invention, at different stages of the packaging processes, respectively.

DETAILED DESCRIPTION OF THE PREFERRED EMBODIMENTS

Referring to FIGS. 1 and 1A1 to 1D2, FIG. 1 shows a flowchart of a method for making an embedded package structure module with high-density electrical connections according to the first embodiment of the present invention, and FIGS. 1A1 to 1D2 show cross-sectional views of an embedded package structure module with high-density electrical connections according to the first embodiment of the present invention, at different stages of the packaging processes, respectively.

Figure 1:
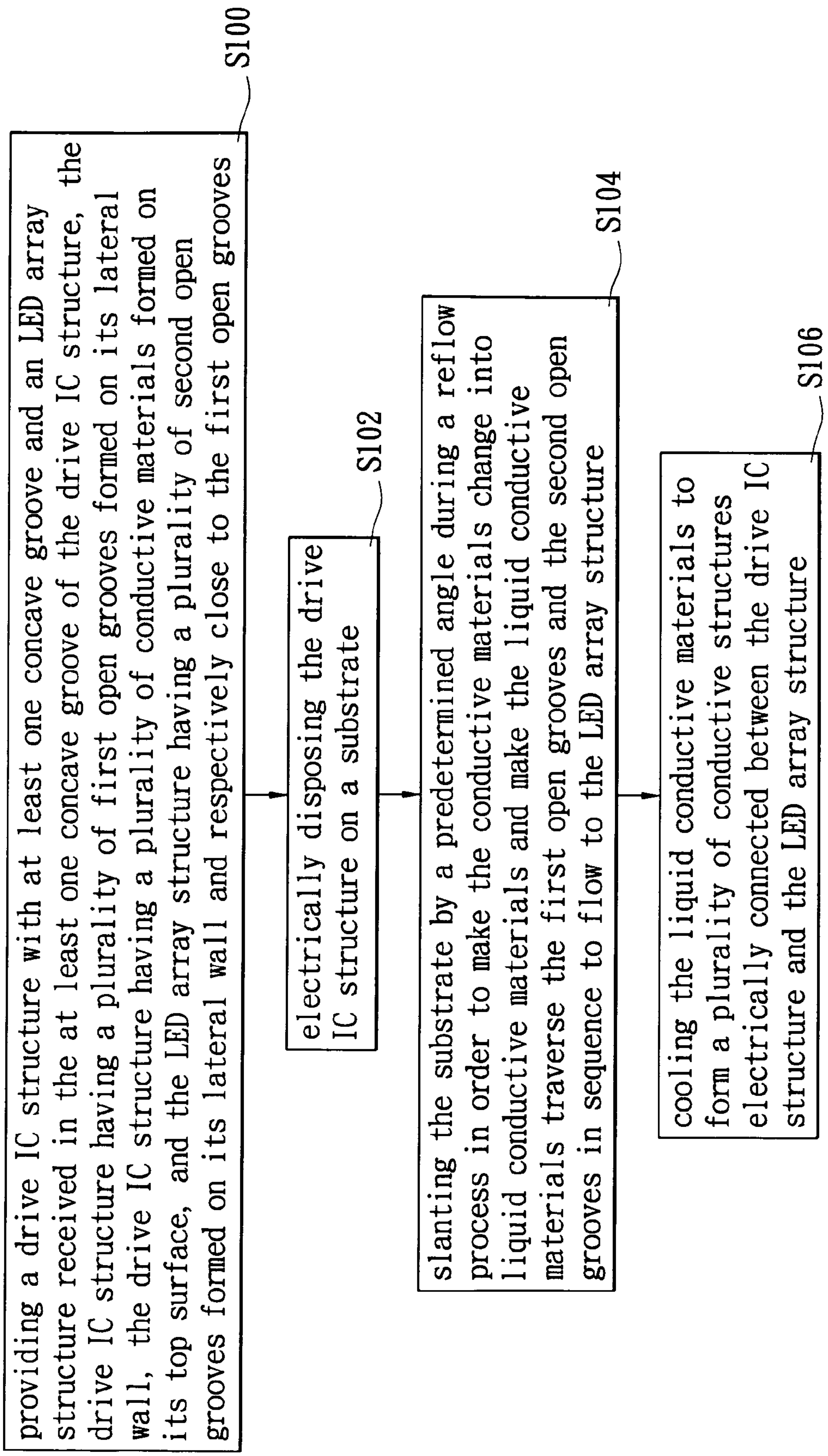
FIG. 1 is a flowchart of a method for making an embedded package structure module with high-density electrical connections according to the first embodiment of the present invention.
Figure 2:
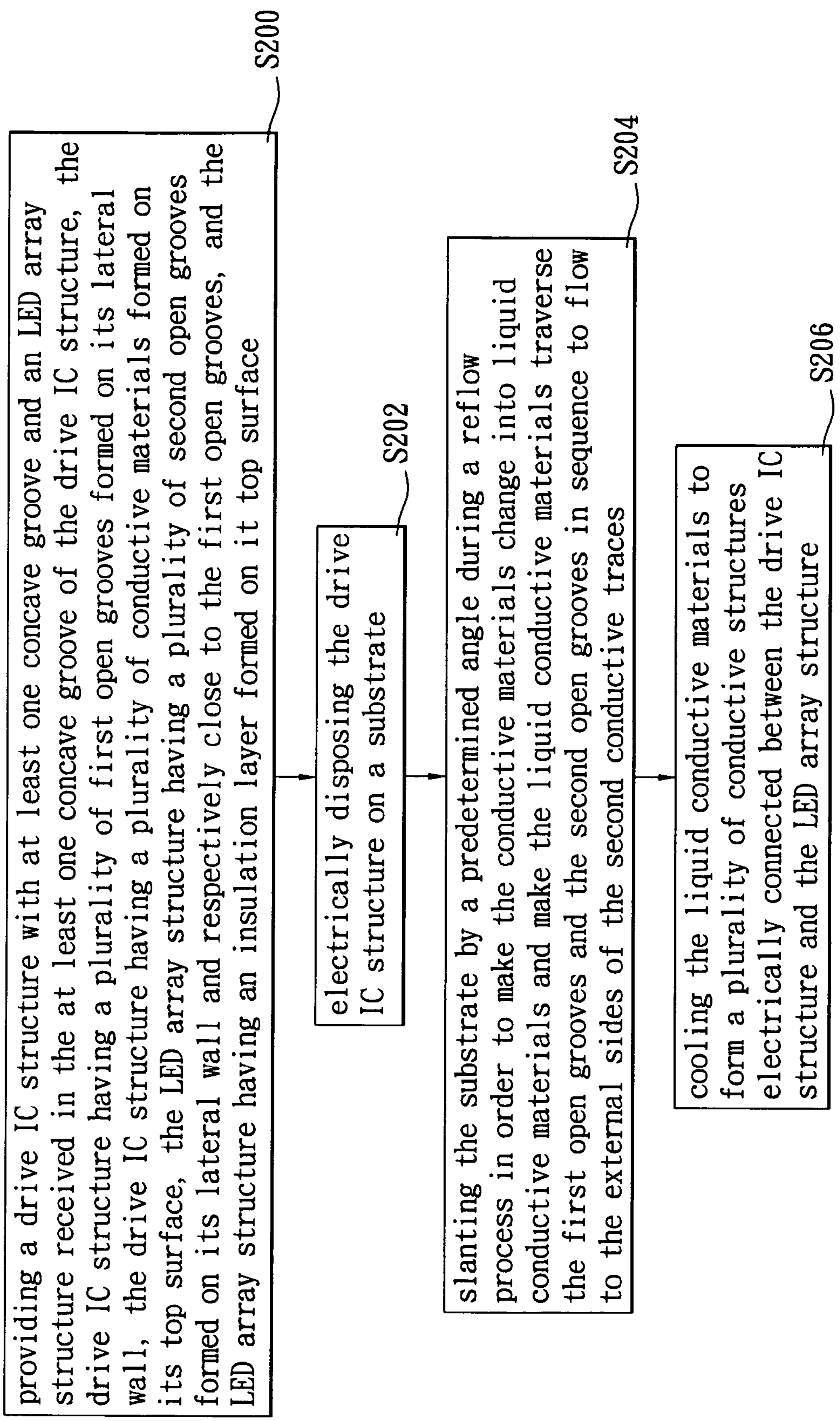

The first embodiment of the present invention provides a method for making an embedded package structure module with high-density electrical connections. The method includes following steps: referring to FIGS. 1, 1A1 and 1A2 (FIG. 1A2 shows a partial top view of FIG. 1A1), the step of S100 is: providing a drive IC structure 1*a* with at least one concave groove 100*a* and an LED array structure 2*a* received in the at least one concave groove 100*a* of the drive IC structure 1*a*, the drive IC structure 1*a* having a plurality of first open grooves 10*a* formed on its lateral wall 1*a*W, the drive IC structure 1*a* having a plurality of conductive materials 3*a*1 formed on its top surface, and the LED array structure 2*a* having a plurality of second open grooves 20*a* formed on its lateral wall 2*a*W and respectively close to the first open grooves 10*a*.

Moreover, the LED array structure 2*a* is received in the at least one concave groove 100*a* of the drive IC structure 1*a* by an adhesive element 200*a*. The height of the top surface of the LED array structure is larger than the height of the top surface of the drive IC structure. Each first open groove 10*a* and each second open groove 20*a* are respectively formed on the lateral wall 1*a*W of the drive IC structure 1*a* and the lateral wall 2*a*W of the LED array structure 2*a* via etching. The at least one concave groove 100*a* are formed via etching. In addition, each first open groove 10*a* or each second open groove 20*a* has a depth of between 50 μm and 100 μm. The conductive materials 3*a*1 are formed on the drive IC structure 1*a* by plating, and the conductive materials 3*a*1 can be solders.

Furthermore, the step of S102 is: electrically disposing the drive IC structure 1*a* on a substrate 4*a*. The substrate 4*a* can be a PCB (Printed Circuit Board). The substrate 4*a* has at least one input/output pad 40*a*. In addition, at least one conductive element 5*a* is connected between the drive IC structure 1*a* and the at least one input/output pad 40*a* of the substrate 4*a*.

Moreover, the drive IC structure 1*a* has a plurality of drive IC pads 11*a* formed on its top surface and a plurality of first conductive traces 12*a*. The drive IC pads 11*a* of the drive IC structure 1*a* correspond to the first open grooves 10*a* and each first conductive trace 12*a* is formed between each corresponding drive IC pad 11*a* and each corresponding first open groove 10*a*. Each first conductive trace 12*a* is formed on the top surface of the drive IC structure 1*a* and is formed on the lateral wall 10*a*W of the corresponding first open groove 10*a* of the drive IC structure 1*a*. In addition, the conductive materials 3*a*1 are respectively formed on the drive IC pads 11*a* of the drive IC structure 1*a*.

Furthermore, the LED array structure 2*a* has a plurality of LED pads 21*a* formed on its top surface and a plurality of second conductive traces 22*a*. The LED pads 21*a* of the LED array structure 2*a* correspond to the second open grooves 20*a* and each second conductive trace 22*a* is formed between each corresponding LED pad 21*a* and each corresponding second open groove 20*a*. Each second conductive trace 22*a* is formed on the top surface of the LED array structure 2*a* and is formed on the lateral wall 20*a*W of the corresponding second open groove 20*a* of the LED array structure 2*a*. In addition, the LED array structure 2*a* has a plurality of LED dies 24*a* connected to the LED pads 21*a* via a plurality of third conductive traces 23*a*, respectively.

With regard to the first embodiment of the present invention, the drive IC pads 11*a* are arranged in a sawtooth shape in order to increase the density of the drive IC pads 11*a*, and the LED pads 21*a* are arranged in a line shape. However, the arrangement of the drive IC pads 11*a* and the LED pads 21*a* does not used to limit the present invention. Any type of arrangement of the pads is protected in the present invention. For example, the drive IC pads 11*a* are arranged in a line shape, and the LED pads 21*a* are arranged in a sawtooth shape; alternatively, the drive pads 11*a* and the LED pads 21*a* are arranged in a line shape or in a sawtooth shape.

Figure 1C:
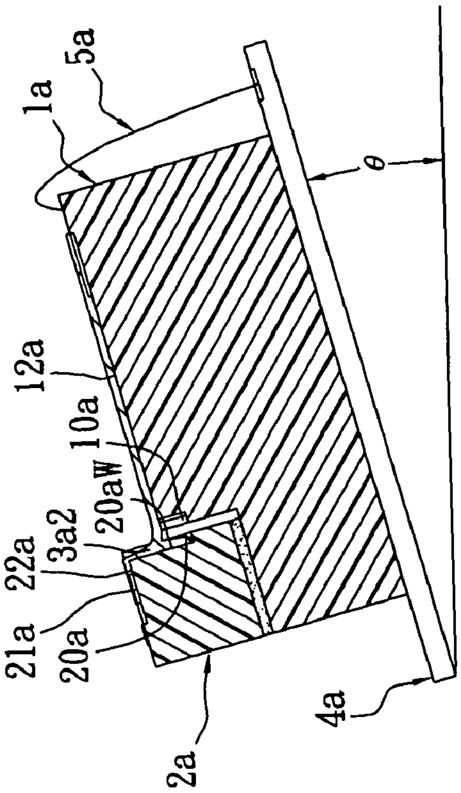
Figure 1B:
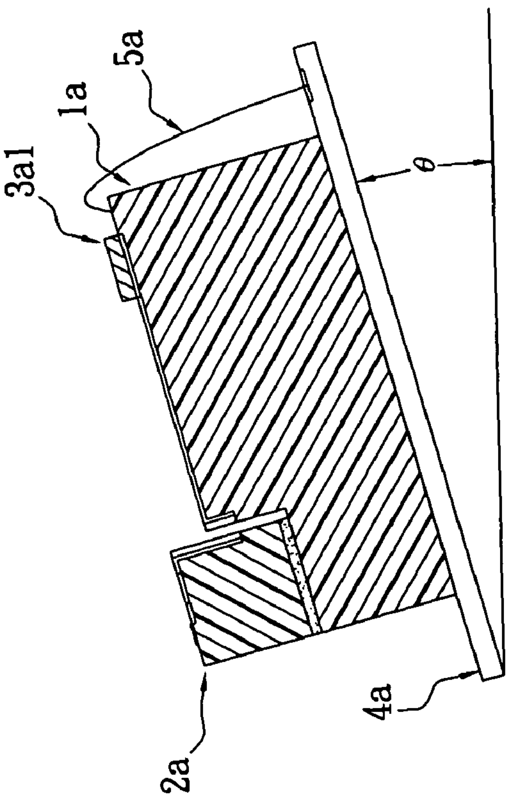

Moreover, referring to FIGS. 1, 1B and 1C, the step of S104 is: slanting the substrate 4*a* by a predetermined angle θ during a reflow process in order to make the conductive materials 3*a*1 (as shown in FIG. 1B) change into liquid conductive materials 3*a*2 (as shown in FIG. 1C) and make the liquid conductive materials 3*a*2 traverse the first open grooves 10*a* and the second open grooves 20*a* in sequence to flow to the LED array structure 2*a*. In other words, each liquid conductive material 3*a*2 flows along the corresponding first conductive trace 12*a*, traverses the corresponding first open groove 10*a* and the corresponding second open groove 20*a*, flows along the lateral wall 20*a*W (each liquid conductive material 3*a*2 flows upward and downward along the lateral wall 20*a*W) of the corresponding second open groove 20*a* and the corresponding second conductive trace 22*a* in sequence, and then reaches the corresponding LED pads 21*a*; Alternatively, each liquid conductive material 3*a*2 flows along the corresponding first conductive trace 12*a*, traverses the corresponding first open groove 10*a* and the corresponding second open groove 20*a*, and then reaches the corresponding second conductive trace 22*a* that is formed on the lateral wall 20*a*W of the corresponding second open groove 20*a*.

Furthermore, referring to FIGS. 1, 1D1 and 1D2 (FIG. 1D2 shows a partial top view of FIG. 1D1), the step of S106 is: cooling the liquid conductive materials 3*a*2 to form a plurality of conductive structures 3A electrically connected between the drive IC structure 1*a* and the LED array structure 2*a*. In addition, each conductive structure 3A is divided into three portions that are a first portion 3A1, a second portion 3A2 and a third portion 3A3, and the second portion 3A2 is electrically connected between the first portion 3A1 and the third portion 3A3. The first portion 3A1 is formed on the corresponding drive IC pad 11*a* and the corresponding first conductive trace 12*a*. The second portion 3A2 traverses the corresponding first open groove 10*a* and the corresponding second open groove 20*a* in sequence and is formed on the corresponding second conductive trace 22*a* formed on the lateral wall 20*a*W of the corresponding second open groove 20*a*. The third portion 3A3 are formed on the corresponding second conductive trace 22*a* in order to electrically connect with the corresponding LED pad 21*a*. Hence, each conductive structure 3A is electrically connected between the corresponding drive IC pad 11*a* of the drive IC structure 1*a* and the corresponding LED pad 21*a* of the LED array structure 2*a*.

Referring to FIGS. 2 and 2A1 to 2D2, FIG. 2 shows a flowchart of a method for making an embedded package structure module with high-density electrical connections according to the second embodiment of the present invention, and FIGS. 2A1 to 2D2 show cross-sectional views of an embedded package structure module with high-density electrical connections according to the second embodiment of the present invention, at different stages of the packaging processes, respectively.

The second embodiment of the present invention provides a method for making an embedded package structure module with high-density electrical connections. The method includes following steps: referring to FIGS. 2, 2A1 and 2A2 (FIG. 2A2 shows a partial top view of FIG. 2A1), the step of S200 is: providing a drive IC structure 1*b* with at least one concave groove 100*b* and an LED array structure 2*b* received in the at least one concave groove 100*b* of the drive IC structure 1*b*, the drive IC structure 1*b* having a plurality of first open grooves 10*b* formed on its lateral wall 1*b*W, the drive IC structure 1*b* having a plurality of conductive materials 3*b*1 formed on its top surface, the LED array structure 2*b* having a plurality of second open grooves 20*b* formed on its lateral wall 2*b*W and respectively close to the first open grooves 10*b*, and the LED array structure 2*b* having an insulation layer 25*b* formed on it top surface.

Moreover, the height of the top surface of the LED array structure 2*b* is larger than the height of the top surface of the drive IC structure 1*b*. Each first open groove 10*b* and each second open groove 20*b* are respectively formed on the lateral wall 1*b*W of the drive IC structure 1*b* and the lateral wall 2*b*W of the LED array structure 2*b* via etching. The at least one concave groove 100*b* are formed via etching. In addition, each first open groove 10*b* or each second open groove 20*b* has a depth of between 50 μm and 100 μm. The conductive materials 3*b*1 are formed on the drive IC structure 1*b* by plating, and the conductive materials 3*b*1 can be solders.

Furthermore, the step of S202 is: electrically disposing the drive IC structure 1*b* on a substrate 4*b*. The substrate 4*b* can be a PCB (Printed Circuit Board). The substrate 4*b* has at least one input/output pad 40*b*. In addition, at least one conductive element 5*b* is connected between the drive IC structure 1*b* and the at least one input/output pads 40*b* of the substrate 4*b*.

Moreover, the drive IC structure 1*b* has a plurality of drive IC pads 11*b* formed on its top surface and a plurality of first conductive traces 12*b*. The drive IC pads 11*b* of the drive IC structure 1*b* correspond to the first open grooves 10*b* and each first conductive trace 12*b* is formed between each corresponding drive IC pad 11*b* and each corresponding first open groove 10*b*. Each first conductive trace 12*b* is formed on the top surface of the drive IC structure 1*b* and is formed on the lateral wall 10*b*W of the corresponding first open groove 10*b* of the drive IC structure 1*b*. In addition, the conductive materials 3*b*1 are respectively formed on the drive IC pads 11*b* of the drive IC structure 1*b*.

Furthermore, the LED array structure 2*b* has a plurality of LED pads 21*b* formed on its top surface and a plurality of second conductive traces 22*b*. The LED pads 21*b* of the LED array structure 2*b* correspond to the second open grooves 20*b* and each second conductive trace 22*b* is formed between each corresponding LED pad 21*b* and each corresponding second open groove 20*b*. Each second conductive trace 22*b* is formed on the top surface of the LED array structure 2*b* and is formed on the lateral wall 20*b*W of the corresponding second open groove 20*b* of the LED array structure 2*b*. In addition, the LED array structure 2*b* has a plurality of LED dies 24*b* connected to the LED pads 21*b* via a plurality of third conductive traces 23*b*, respectively.

In addition, the insulation layer 25*b* formed on the top surface of the LED array structure 2*b* exposes the LED dies 24*b* and external sides 220*b* of the second conductive traces 22*b*.

With regard to the second embodiment of the present invention, the drive IC pads 11*b* are arranged in a sawtooth shape in order to increase the density of the drive IC pads 11*b*, and the LED pads 21*b* are arranged in a line shape.

Figure 2C:
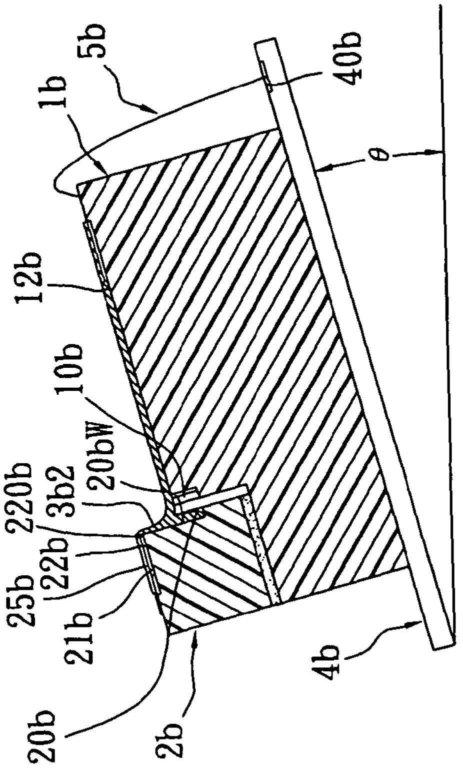
Figure 2B:
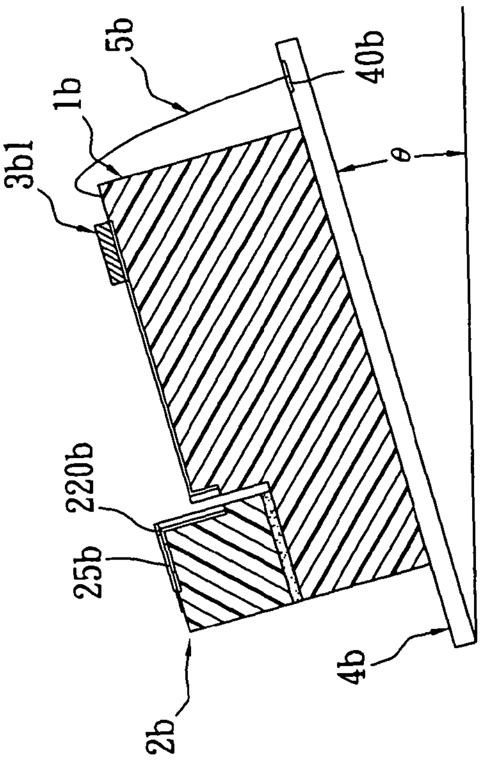

Moreover, referring to FIGS. 2, 2B and 2C, the step of S204 is: slanting the substrate 4*b* by a predetermined angle θ during a reflow process in order to make the conductive materials 3*b*1 (as shown in FIG. 2B) change into liquid conductive materials 3*b*2 (as shown in FIG. 2C) and make the liquid conductive materials 3*b*2 traverse the first open grooves 10*b* and the second open grooves 20*b* in sequence to flow to the external sides 220*b* of the second conductive traces 22*b*. In other words, each liquid conductive material 3*b*2 flows along the corresponding first conductive trace 12*b*, traverses the corresponding first open groove 10*b* and the corresponding second open groove 20*b*, flows along the lateral wall 20*b*W (each liquid conductive material 3*b*2 flows upward and downward along the lateral wall 20*b*W) of the corresponding second open groove 20*b*, and then reaches the external side 220*b* of the corresponding second conductive trace 22*b* (the liquid conductive materials 3*b*2 is stopped on the external sides 220*b* of the second conductive traces 22*b* via the insulation layer 25*b*); Alternatively, each liquid conductive material 3*b*2 flows along the corresponding first conductive trace 12*b*, traverses the corresponding first open groove 10*b* and the corresponding second open groove 20*b*, and then reaches the corresponding second conductive trace 22*b* that is formed on the lateral wall 20*b*W of the corresponding second open groove 20*b*.

Furthermore, referring to FIGS. 2, 2D1 and 2D2 (FIG. 2D2 shows a partial top view of FIG. 2D1), the step of S206 is: cooling the liquid conductive materials 3*b*2 to form a plurality of conductive structures 3B electrically connected between the drive IC structure 1*b* and the LED array structure 2*b*. In addition, each conductive structure 3B is divided into a first portion 3B1 and a second portion 3B2 electrically connected to each other. The first portion 3B1 is formed on the corresponding drive IC pad 11*b* and the corresponding first conductive trace 12*b*. The second portion 3B2 traverses the corresponding first open groove 10*b* and the corresponding second open groove 20*b* in sequence and is formed on its lateral wall 20*b*W of the corresponding second open groove 20*b* and the external side 220*b* of the corresponding second conductive trace 22*b* due to the obstruction of the insulation layer 25*b*. Hence, each conductive structure 3B is electrically connected between the corresponding drive IC pad 11*b* of the drive IC structure 1*b* and the external side 220*b* of the corresponding second conductive trace 22*b* in order to make each corresponding drive IC pad 11*b* electrically connect with the corresponding LED pad 21*b*.

Referring to FIGS. 3 and 3A1 to 3D2, FIG. 3 shows a flowchart of a method for making an embedded package structure module with high-density electrical connections according to the third embodiment of the present invention, and FIGS. 3A1 to 3D2 show cross-sectional views of an embedded package structure module with high-density electrical connections according to the third embodiment of the present invention, at different stages of the packaging processes, respectively.

Figure 3:
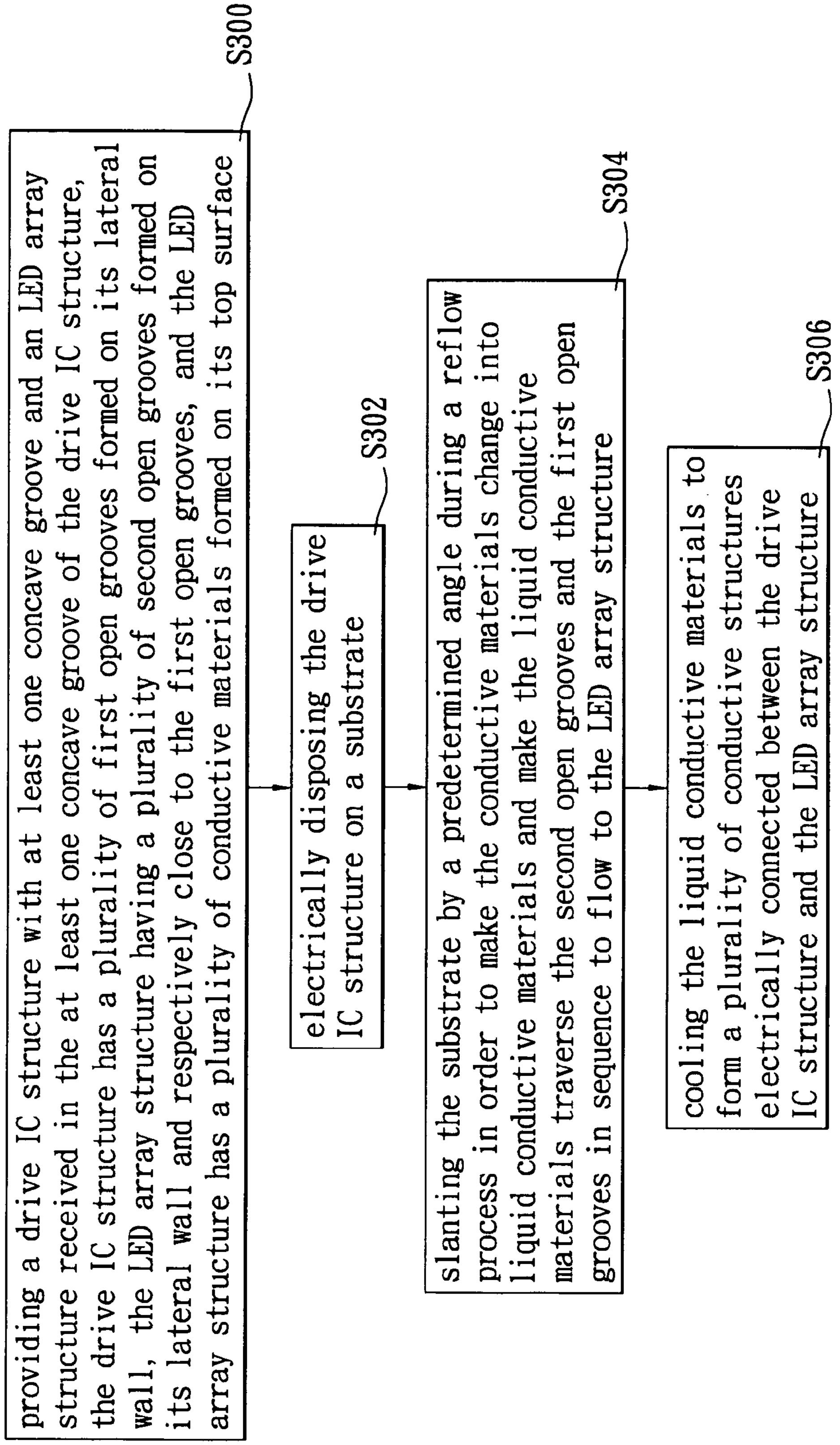
FIG. 3 is a flowchart of a method for making an embedded package structure module with high-density electrical connections according to the third embodiment of the present invention.

The third embodiment of the present invention provides a method for making an embedded package structure module with high-density electrical connections. The method includes following steps: referring to FIGS. 3, 3A1 and 3A2 (FIG. 3A2 shows a partial top view of FIG. 3A1), the step of S300 is: providing a drive IC structure 1*c* with at least one concave groove 100*c* and an LED array structure 2*c* received in the at least one concave groove 100*c* of the drive IC structure 1*c*, the drive IC structure 1*c* has a plurality of first open grooves 10*c* formed on its lateral wall 1*c*W, the LED array structure 2*c* having a plurality of second open grooves 20*c* formed on its lateral wall 2*c*W and respectively close to the first open grooves 10*c*, and the LED array structure 2*c* has a plurality of conductive materials 3*c*1 formed on its top surface.

Moreover, the LED array structure 2*c* is received in the at least one concave groove 100*c* of the drive IC structure 1*c* by an adhesive element 200*c*. The height of the top surface of the LED array structure is smaller than the height of the top surface of the drive IC structure. Each first open groove 10*c* and each second open groove 20*c* are respectively formed on the lateral wall 1*c*W of the drive IC structure 1*c* and the lateral wall 2*c*W of the LED array structure 2*c* via etching. The at least one concave groove 100*c* are formed via etching. In addition, each first open groove 10*c* or each second open groove 20*c* has a depth of between 50 μm and 100 μm. The conductive materials 3*c*1 are formed on the drive IC structure 1*c* by plating, and the conductive materials 3*c*1 can be solders.

Furthermore, the step of S302 is: electrically disposing the drive IC structure 1*c* on a substrate 4*c*. The substrate 4*c* can be a PCB (Printed Circuit Board). The substrate 4*c* has at least one input/output pad 40*c*. In addition, at least one conductive element 5*c* is connected between the drive IC structure 1*c* and the at least one input/output pad 40*c* of the substrate 4*c*:

Moreover, the drive IC structure 1*c* has a plurality of drive IC pads 11*c* formed on its top surface and a plurality of first conductive traces 12*c*. The drive IC pads 11*c* of the drive IC structure 1*c* correspond to the first open grooves 10*c* and each first conductive trace 12*c* is formed between each corresponding drive IC pad 11*c* and each corresponding first open groove 10*c*. Each first conductive trace 12*c* is formed on the top surface of the drive IC structure 1*c* and is formed on the lateral wall 10*c*W of the corresponding first open groove 10*c* of the drive IC structure 1*c*.

Furthermore, the LED array structure 2*c* has a plurality of LED pads 21*c* formed on its top surface and a plurality of second conductive traces 22*c*. The LED pads 21*c* of the LED array structure 2*c* correspond to the second open grooves 20*c* and each second conductive trace 22*c* is formed between each corresponding LED pad 21*c* and each corresponding second open groove 20*c*. Each second conductive trace 22*c* is formed on the top surface of the LED array structure 2*c* and is formed on the lateral wall 20*c*W of the corresponding second open groove 20*c* of the LED array structure 2*c*. In addition, the conductive materials 3*c*1 are respectively formed on the LED pads 21C of the LED array structure 1*c*. The LED array structure 2*c* has a plurality of LED dies 24*c* connected to the LED pads 21*c* via a plurality of third conductive traces 23*c*, respectively.

With regard to the first embodiment of the present invention, the drive IC pads 11*c* are arranged in a sawtooth shape in order to increase the density of the drive IC pads 11*c*, and the LED pads 21*c* are arranged in a line shape.

Figure 3C:
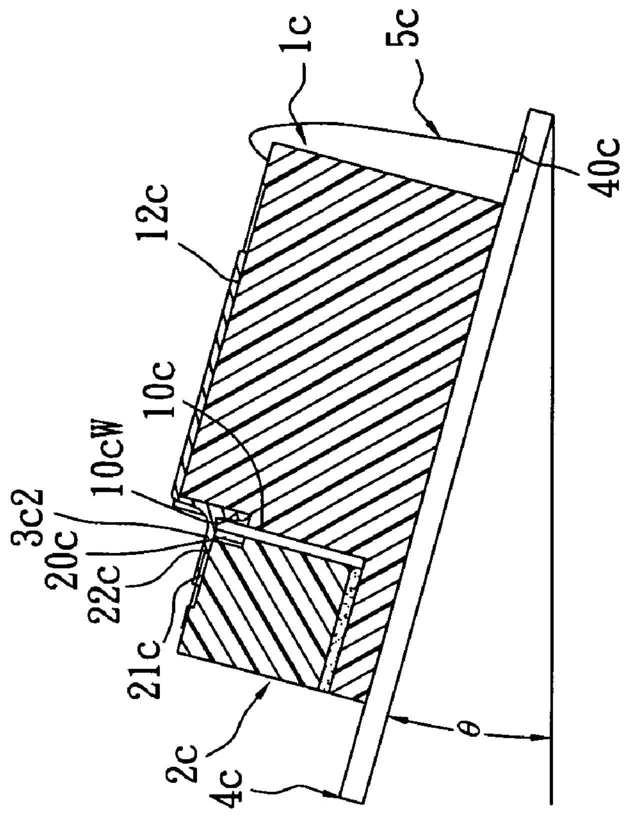
Figure 3B:
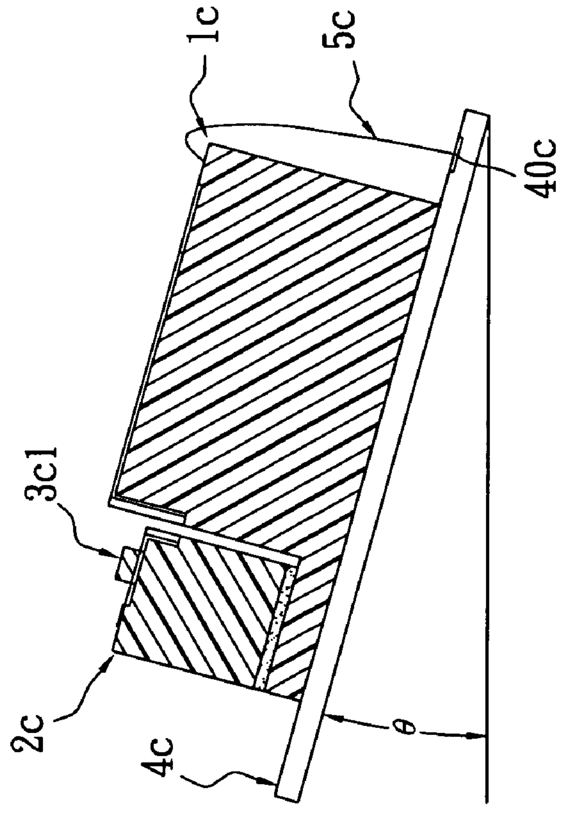

Moreover, referring to FIGS. 3, 3B and 3C, the step of S304 is: slanting the substrate 4*c* by a predetermined angle θ during a reflow process in order to make the conductive materials 3*c*1 (as shown in FIG. 3B) change into liquid conductive materials 3*c*2 (as shown in FIG. 3C) and make the liquid conductive materials 3*c*2 traverse the second open grooves 20*c* and the first open grooves 10*c* in sequence to flow to the LED array structure 2*c*. In other words, each liquid conductive material 3*c*2 flows along the corresponding second conductive trace 22*c*, traverses the corresponding second open groove 20*c* and the corresponding first open groove 10*c*, flows along the lateral wall 10*c*W (each liquid conductive material 3*c*2 flows upward and downward along the lateral wall 10*c*W) of the corresponding first open groove 10*c* and the corresponding first conductive trace 12*c* in sequence, and then reaches the corresponding drive IC pads 11*c*; Alternatively, each liquid conductive material 3*c*2 flows along the corresponding second conductive trace 22*c*, traverses the corresponding second open groove 20*c* and the corresponding first open groove 10*c*, and then reaches the corresponding first conductive trace 12*c* that is formed on the lateral wall 10*c*W of the corresponding first open groove 10*c*.

Furthermore, referring to FIGS. 3, 3D1 and 3D2 (FIG. 3D2 shows a partial top view of FIG. 3D1), the step of S306 is: cooling the liquid conductive materials 3*c*2 to form a plurality of conductive structures 3C electrically connected between the drive IC structure 1*c* and the LED array structure 2*c*. In addition, each conductive structure 3C is divided into three portions that are a first portion 3C1, a second portion 3C2 and a third portion 3C3, and the second portion 3C2 is electrically connected between the first portion 3C1 and the third portion 3C3. The first portion 3C1 is formed on the corresponding LED pad 21*c* and the corresponding second conductive trace 22*c*. The second portion 3C2 traverses the corresponding second open groove 20*c* and the corresponding first open groove 10*c* in sequence and is formed on the corresponding first conductive trace 12*c* formed on the lateral wall 10*c*W of the corresponding first open groove 10*c*. The third portion 3C3 is formed on the corresponding first conductive trace 12*c* in order to electrically connect with the corresponding drive IC pad 11*c*. Hence, each conductive structure 3C is electrically connected between the corresponding drive IC pad 11*c* of the drive IC structure 1*c* and the corresponding LED pad 21*c* of the LED array structure 2*c*.

Referring to FIGS. 4 and 4A1 to 4D2, FIG. 4 shows a flowchart of a method for making an embedded package structure module with high-density electrical connections according to the third embodiment of the present invention, and FIGS. 4A1 to 4D2 show cross-sectional views of an embedded package structure module with high-density electrical connections according to the fourth embodiment of the present invention, at different stages of the packaging processes, respectively.

Figure 4:
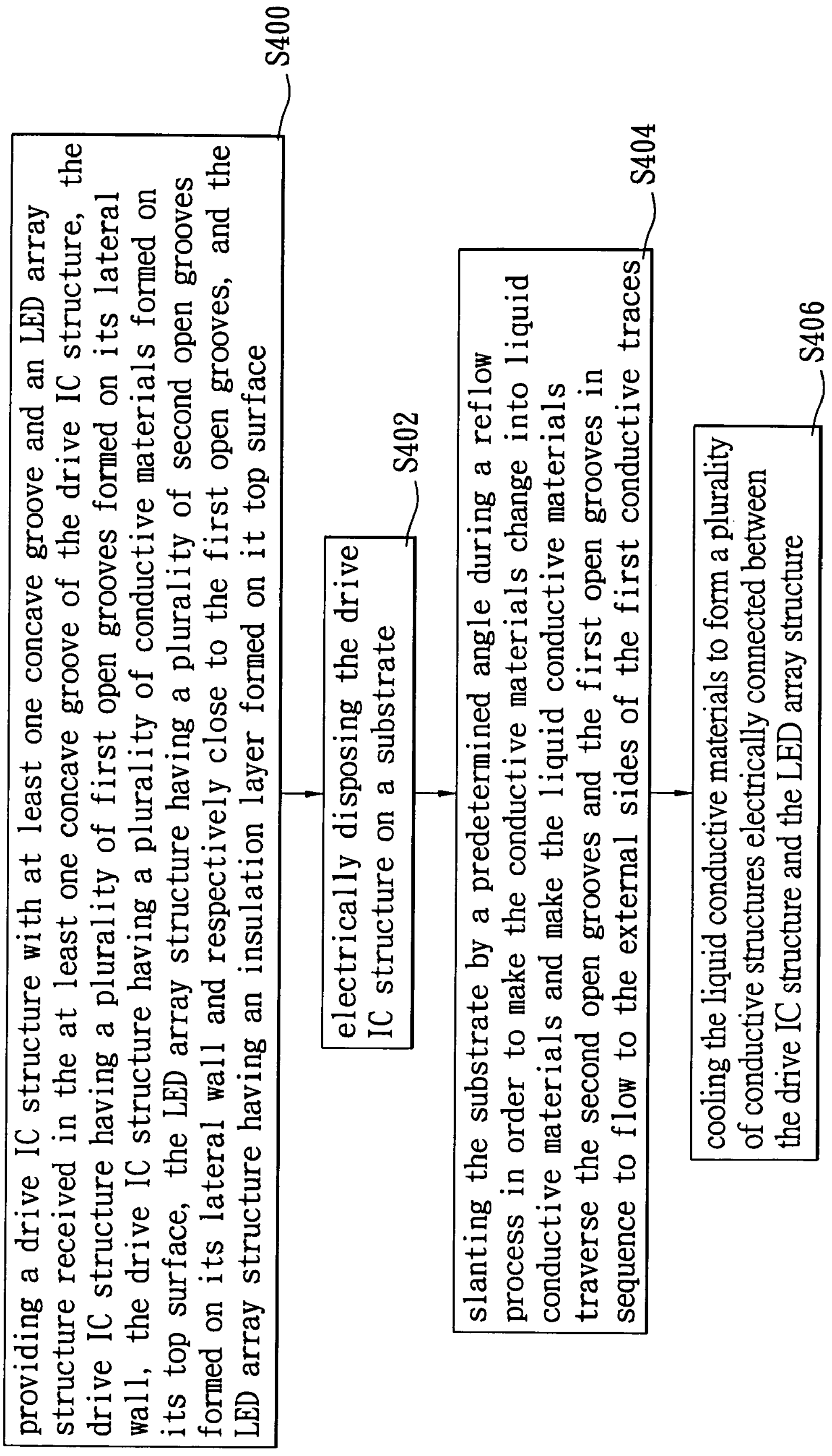
FIG. 4 is a flowchart of a method for making an embedded package structure module with high-density electrical connections according to the fourth embodiment of the present invention.

The fourth embodiment of the present invention provides a method for making an embedded package structure module with high-density electrical connections. The method includes following steps: referring to FIGS. 4, 4A1 and 4A2 (FIG. 4A2 shows a partial top view of FIG. 4A1), the step of S400 is: providing a drive IC structure 1*d* with at least one concave groove 100*d* and an LED array structure 2*d* received in the at least one concave groove 100*d* of the drive IC structure 1*d*, the drive IC structure 1*d* having a plurality of first open grooves 10*d* formed on its lateral wall 1*d*W, the drive IC structure 1*d* having a plurality of conductive materials 3*d*1 formed on its top surface, the LED array structure 2*d* having a plurality of second open grooves 20*d* formed on its lateral wall 2*d*W and respectively close to the first open grooves 10*d*, and the LED array structure 2*d* having an insulation layer 25*d* formed on it top surface.

Moreover, the LED array structure 2*d* is received in the at least one concave groove 100*d* of the drive IC structure 1*d* by an adhesive element 200*d*. The height of the top surface of the LED array structure 2*d* is smaller than the height of the top surface of the drive IC structure 1*d*. Each first open groove 10*d* and each second open groove 20*d* are respectively formed on the lateral wall 1*d*W of the drive IC structure 1*d* and the lateral wall 2*d*W of the LED array structure 2*d* via etching. The at least one concave groove 100*d* are formed via etching. In addition, each first open groove 10*d* or each second open groove 20*d* has a depth of between 50 μm and 100 μm. The conductive materials 3*d*1 are formed on the drive IC structure 1*d* by plating, and the conductive materials 3*d*1 can be solders.

Furthermore, the step of S402 is: electrically disposing the drive IC structure 1*d* on a substrate 4*d*. The substrate 4*d* can be a PCB (Printed Circuit Board). The substrate 4*d* has at least one input/output pad 40*d*. In addition, at least one conductive element 5*d* is connected between the drive IC structure 1*d* and the at least one input/output pad 40*d* of the substrate 4*d*.

Moreover, the drive IC structure 1*d* has a plurality of drive IC pads 1*d* formed on its top surface and a plurality of first conductive traces 12*d*. The drive IC pads 1*d* of the drive IC structure 1*d* correspond to the first open grooves 10*d* and each first conductive trace 12*d* is formed between each corresponding drive IC pad 11*d* and each corresponding first open groove 10*d*. Each first conductive trace 12*d* is formed on the top surface of the drive IC structure 1*d* and is formed on the lateral wall 10*d*W of the corresponding first open groove 10*d* of the drive IC structure 1*d*.

Furthermore, the LED array structure 2*d* has a plurality of LED pads 21*d* formed on its top surface and a plurality of second conductive traces 22*d*. The LED pads 21*d* of the LED array structure 2*d* correspond to the second open grooves 20*d* and each second conductive trace 22*d* is formed between each corresponding LED pad 21*d* and each corresponding second open groove 20*d*. Each second conductive trace 22*d* is formed on the top surface of the LED array structure 2*d* and is formed on the lateral wall 20*d*W of the corresponding second open groove 20*d* of the LED array structure 2*d*. In addition, the conductive materials 3*d*1 are respectively formed on the LED pads 21*d* of the LED array structure 2*d*. The LED array structure 2*d* has a plurality of LED dies 24*d* connected to the LED pads 21*d* via a plurality of third conductive traces 23*d*, respectively.

In addition, the insulation layer 25*d* formed on the top surface of the drive IC structure 1*d* is used to expose the drive IC pads 1*d* and external sides 120*d* of the first conductive traces 12*d*.

With regard to the fourth embodiment of the present invention, the drive IC pads 1*d* are arranged in a sawtooth shape in order to increase the density of the drive IC pads 11*d*, and the LED pads 21*d* are arranged in a line shape.

Figure 4C:
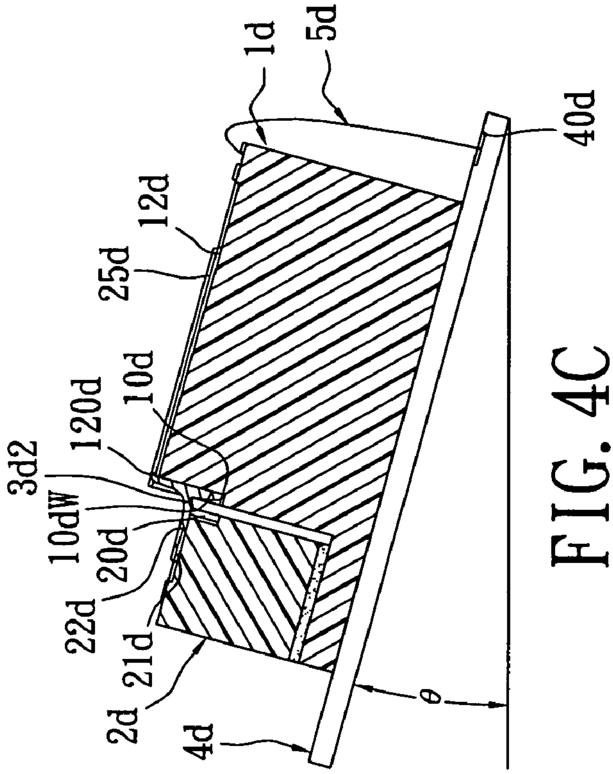
Figure 4B:
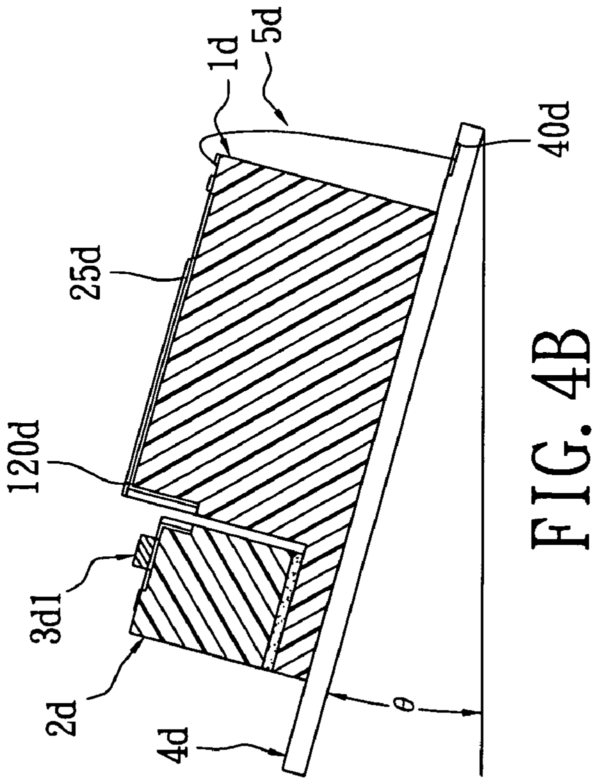

Moreover, referring to FIGS. 4, 4B and 4C, the step of S404 is: slanting the substrate 4*d* by a predetermined angle θ during a reflow process in order to make the conductive materials 3*d*1 (as shown in FIG. 4B) change into liquid conductive materials 3*d*2 (as shown in FIG. 4C) and make the liquid conductive materials 3*d*2 traverse the second open grooves 20*d* and the first open grooves 10*d* in sequence to flow to the external sides 120*d* of the first conductive traces 12*d*. In other words, each liquid conductive material 3*d*2 flows along the corresponding second conductive trace 22*d*, traverses the corresponding second open groove 20*d* and the corresponding first open groove 10*d*, flows along the lateral wall 10*d*W (each liquid conductive material 3*d*2 flows upward and downward along the lateral wall 10*d*W) of the corresponding first open groove 10*d*, and then reaches the external side 120*d* of the corresponding first conductive trace 12*d* (the liquid conductive materials 3*d*2 is stopped on the external sides 120*d* of the first conductive traces 12*d* via the insulation layer 25*d*); Alternatively, each liquid conductive material 3*d*2 flows along the corresponding second conductive trace 22*d*, traverses the corresponding second open groove 20*d* and the corresponding first open groove 10*d*, and then reaches the corresponding first conductive trace 12*d* that is formed on the lateral wall 10*d*W of the corresponding first open groove 10*d*.

Furthermore, referring to FIGS. 4, 4D1 and 4D2 (FIG. 4D2 shows a partial top view of FIG. 4D1), the step of S406 is: cooling the liquid conductive materials 3*d*2 to form a plurality of conductive structures 3D electrically connected between the drive IC structure 1*d* and the LED array structure 2*d*. In addition, each conductive structure 3D is divided into a first portion 3D1 and a second portion 3D2 electrically connected to each other. The first portion 3D1 is formed on the corresponding LED pad 21*d* and the corresponding second conductive trace 22*d*. The second portion 3D2 traverses the corresponding second open groove 20*d* and the corresponding first open groove 10*d* in sequence and is formed on its lateral wall 10*d*W of the corresponding first open groove 10*d* and the external side 120*d* of the corresponding first conductive trace 12*d* due to the obstruction of the insulation layer 25*d*. Hence, each conductive structure 3D is electrically connected between the corresponding LED pad 21*d* of the LED array structure 1*d* and the external side 120*d* of the corresponding first conductive trace 12*d* in order to make each corresponding drive IC pad 11*d* electrically connect with the corresponding LED pad 21*d*.

In addition, according to designer's requirements, one structure that has the conductive materials thereon does not need to form open grooves. In other words, such as the first embodiment, the first open grooves 10*a* do not need to form on the drive IC structure 1*a* firstly. Hence, the liquid conductive materials 3*a*2 only needs to respectively traverse the second open grooves 20*a* of the LED array structure 2*a*, the conductive structures 3B are formed between the drive IC structure 1*a* and the LED array structure 2*a*. Such as the third embodiment, the second open grooves 20*c* do not need to form on the LED array structure 2*c* firstly. Hence, the liquid conductive materials 3*c*2 only needs to respectively traverse the first open grooves 10*c* of the drive IC structure 1*c*, the conductive structures 3C are formed between the drive IC structure 1*c* and the LED array structure 2*c*.

In conclusion, the embedded package structure module is an LED array structure module, and the LED array structure module is a light exposure module that can be applied to an EPG (Electrophotography) printer.

The features of the present invention include (1) forming at least one concave groove on a top surface of a drive IC structure; (2) receiving an LED array structure in the at least one concave groove (there is a height difference between the drive IC structure and the LED array structure); (3) forming concave grooves on a lateral wall of the drive IC structure and a lateral wall of the LED array structure for electrically connection (the lateral wall of the drive IC structure is close to the lateral wall of the LED array structure); (4) electroplating solder materials onto the drive IC structure; (5) slanting the PCB by a predetermined angle during a reflow process in order to make the solder materials flow to the LED array structure on a low position to connect to the pads of the LED array structure. Hence, the present invention can reach a high-density electrical connection with 600~1200 dip. Therefore, the present invention can reduce product size, material cost, and manufacturing cost due to high-density electrical connection.

In conclusion, the present invention does not need to use a wire-bonding process as in the prior art that requires a long time and the present invention can solve the problem of the complex method for making a package structure module with high-density electrical connections of the prior art (particularly relates to the semiconductor procedures). Hence, the present invention not only can reduce product size, material cost, and manufacturing cost, but also increases production speed.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An embedded package structure module with high-density electrical connections, comprising:

a drive IC structure having a first lateral wall and a bottom portion extending from said first lateral wall and defining at least one concave groove therewith, wherein said first lateral wall extends between an upper surface of said drive IC structure and a top surface of said bottom portion, and wherein at least one first open groove is formed along said first lateral wall in proximity to said upper surface of said drive IC structure;

an LED array structure received in said at least one concave groove of the drive IC structure, wherein said bottom portion of said drive IC structure underlies said LED array structure, wherein the LED array structure has a second lateral wall and at least one second open grooves formed along said second lateral wall in facing alignment with said at least one first open groove of said drive IC structure; and a plurality of conductive structures respectively traversing said first and second open grooves, thereby electrically connecting said drive IC structure and said LED array structure.

2. The embedded package structure module as claimed in claim 1, wherein the height of said drive IC structure defined between said upper surface and a lower surface thereof differs from the height of said LED array structure.

3. The embedded package structure module as claimed in claim 2, wherein the drive IC structure has at least one drive IC pads formed on said upper surface thereof in correspondence with said at least one first open groove, and wherein the LED array structure has at least one LED pads formed on a top surface thereof in correspondence with said at least one second open groove.

4. The embedded package structure module as claimed in claim 2, wherein the drive IC structure has a plurality of drive IC pads formed on said upper surface thereof and a plurality of first conductive traces, wherein each of said plurality of drive IC pads, respectively, corresponds to a respective one of said at least one first open groove, each of said plurality of first conductive traces being formed between a respective one of said of drive IC pads and said respective first open groove, wherein the LED array structure has a plurality of LED pads formed on a top surface thereof and a plurality of second conductive traces, wherein each of said plurality of LED pads respectively corresponds to a respective at least one second open groove, and wherein each of said plurality of second conductive traces is formed between said LED pad and said respective at least one second open groove.

5. The embedded package structure module as claimed in claim 4, wherein the LED array structure has an insulation layer formed on said top surface thereof in order to expose the LED pads and external sides of the second conductive traces.

6. The embedded package structure module as claimed in claim 5, wherein each said conductive structure is divided into a first portion and a second portion electrically connected to each other, the first portion being formed on a corresponding drive IC pad and a corresponding first conductive trace, and the second portion traversing the corresponding first open groove and the corresponding second open groove in sequence and being formed on said second lateral wall of the corresponding second open groove and the external side of the corresponding second conductive trace due to the obstruction of the insulation layer.

7. The embedded package structure module as claimed in claim 1, wherein said at least one first open groove has a depth ranging between 50 μm and 100 μm, and said at least one second open groove has a depth of ranging between 50 μm and 100 μm.

8. The embedded package structure module as claimed in claim 1, further comprising a substrate with at least one input/output pad and at least one conductive element, wherein the drive IC structure is electrically disposed on the substrate with said lower surface of said drive IC structure in contact with said substrate, wherein the conductive element is electrically connected between the drive IC structure and said at least one input/output pad of the substrate, and wherein said LED array structure is separated from said substrate by said bottom portion of said drive IC structure.

* * * * *